US010797234B2

(12) United States Patent
Hinsinger

(10) Patent No.: US 10,797,234 B2
(45) Date of Patent: Oct. 6, 2020

(54) MEMORY CELL COMPRISING A PHASE-CHANGE MATERIAL

(71) Applicant: STMicroelectronics (Crolles 2) SAS, Crolles (FR)

(72) Inventor: Olivier Hinsinger, Barraux (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 16/182,990

(22) Filed: Nov. 7, 2018

(65) Prior Publication Data
US 2019/0140175 A1 May 9, 2019

(30) Foreign Application Priority Data

Nov. 9, 2017 (FR) .................... 17 60542

(51) Int. Cl.
*H01L 45/00* (2006.01)
*H01L 27/24* (2006.01)
*G11C 13/00* (2006.01)

(52) U.S. Cl.
CPC .......... *H01L 45/06* (2013.01); *G11C 13/0004* (2013.01); *G11C 13/0069* (2013.01); *H01L 27/2436* (2013.01); *H01L 27/2463* (2013.01); *H01L 45/04* (2013.01); *H01L 45/065* (2013.01); *H01L 45/126* (2013.01); *H01L 45/1233* (2013.01); *H01L 45/1293* (2013.01); *H01L 45/16* (2013.01); *H01L 45/1608* (2013.01); *G11C 2013/008* (2013.01)

(58) Field of Classification Search
CPC ... H01L 45/1293; H01L 45/06; H01L 45/065; H01L 45/1233; H01L 45/126; H01L 45/16; H01L 45/1608; H01L 27/2463; H01L 45/04; G11C 13/0004; G11C 13/0069; G11C 2013/008
See application file for complete search history.

(56) References Cited

U.S. PATENT DOCUMENTS

| 2009/0008622 | A1 | 1/2009 | Kim |
| 2015/0028283 | A1* | 1/2015 | Redaelli ............. H01L 45/1675 257/5 |
| 2015/0280117 | A1 | 10/2015 | Boniardi et al. |
| 2017/0018708 | A1 | 1/2017 | Redaelli et al. |

OTHER PUBLICATIONS

INPI Search Report and Written Opinion for FR 1760542 dated May 22, 2018 (10 pages).
EPO Search Report and Written Opinion for co-pending EP Appl. No. 18204452.9 dated Mar. 6, 2019 (12 pages).

* cited by examiner

*Primary Examiner* — Feifei Yeung Lopez
(74) *Attorney, Agent, or Firm* — Crowe & Dunlevy

(57) ABSTRACT

A memory cell includes a heating element topped with a phase-change material. Two first silicon oxide regions laterally surround the heating element along a first direction. Two second silicon oxide regions laterally surround the heating element along a second direction orthogonal to the first direction. Top surfaces of the heating element and the two first silicon oxide regions are coplanar such that the heating element and the two first silicon oxide regions have a same thickness.

11 Claims, 4 Drawing Sheets

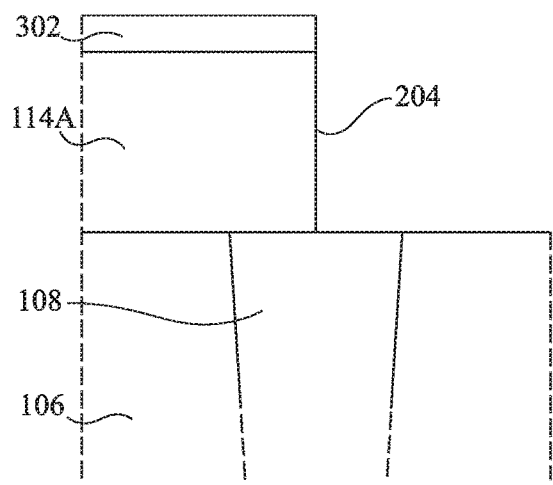
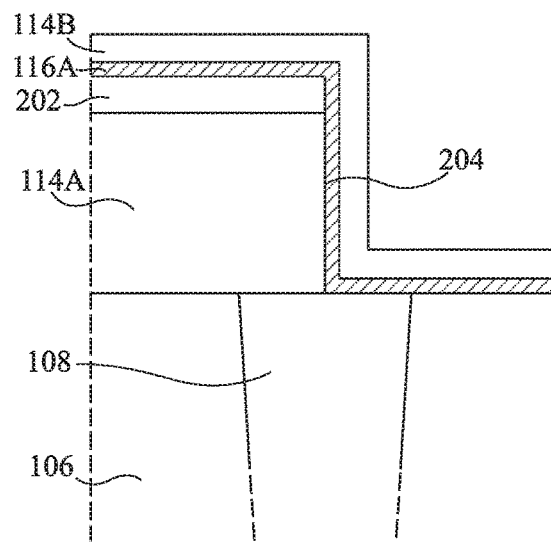
Fig 2A
Fig 2B
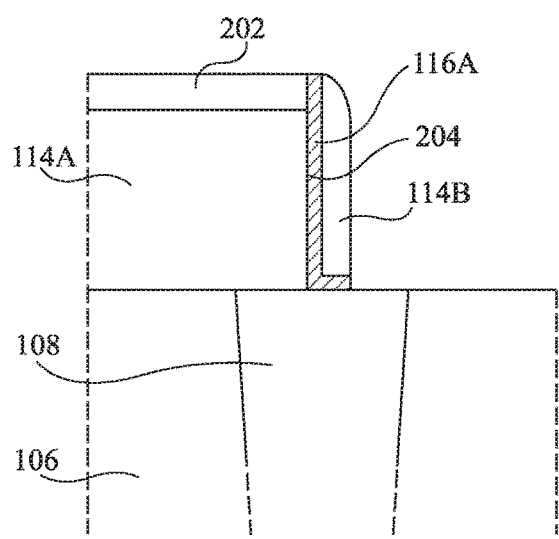
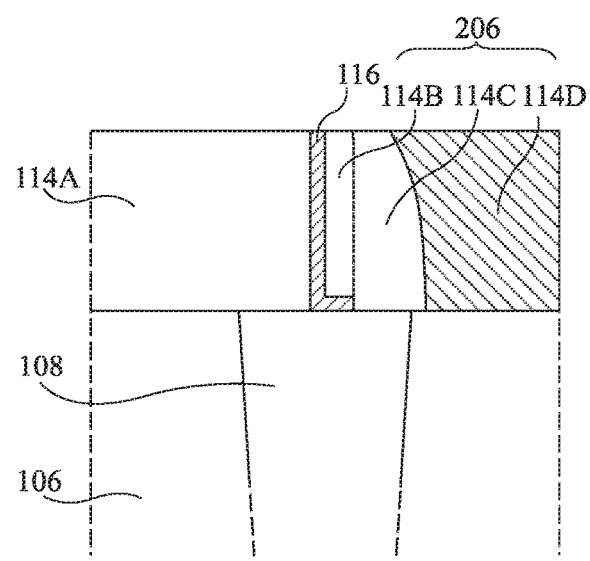
Fig 2C
Fig 2D

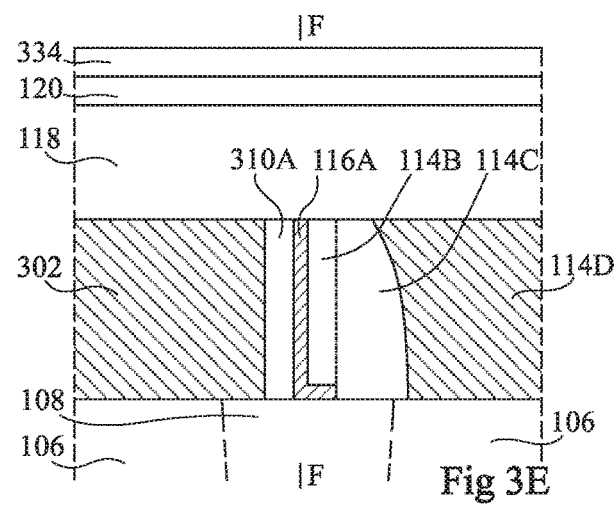
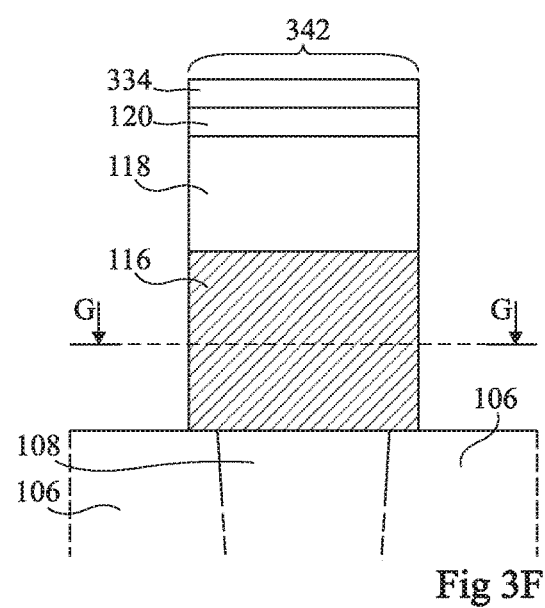
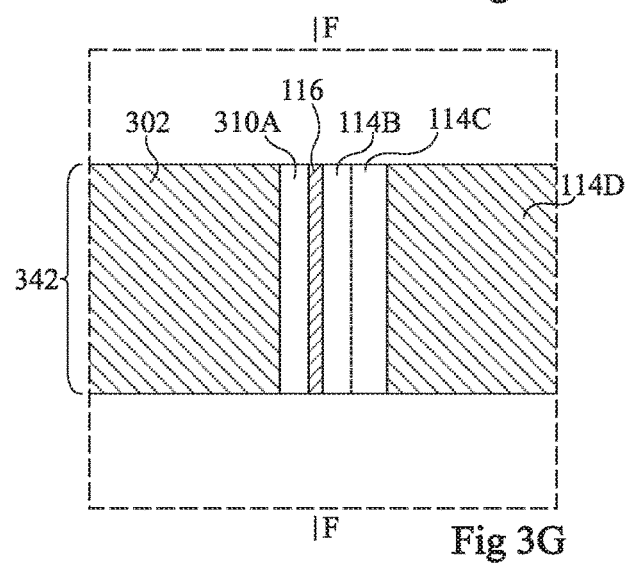
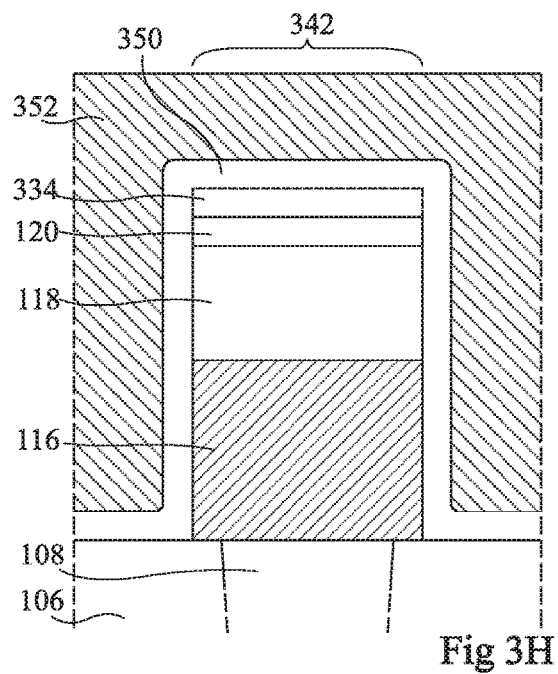
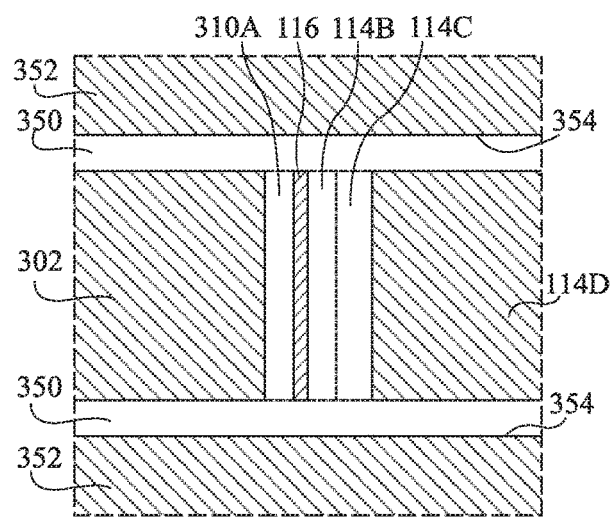

MEMORY CELL COMPRISING A PHASE-CHANGE MATERIAL

PRIORITY CLAIM

This application claims the priority benefit of French Application for Patent No. 1760542, filed on Nov. 9, 2017, the content of which is hereby incorporated by reference in its entirety to the maximum extent allowable by law.

TECHNICAL FIELD

The present disclosure relates to electronic chips and, more particularly, to a non-volatile memory cell comprising a phase-change material in an electronic chip.

BACKGROUND

In a memory cell comprising a phase-change material, the phase-change material, for example, a chalcogenide, is coupled to a resistive heating element. To program such a memory cell, the chalcogenide, initially in the crystalline state, is heated to melt a portion thereof. After the heating has stopped, the molten portion cools down sufficiently fast to become amorphous. To erase the memory cell, the chalcogenide is heated without being melted, so that the amorphous portion recrystallizes. The reading of the programmed or erased state of the memory cell uses the difference between the electric conductivity of the amorphous chalcogenide and of the crystalline chalcogenide.

Known memory cells comprising a phase-change material have various disadvantages, such as a high current for the programming, and various compactness issues. Such issues are crucial, for example, for an electronic chip comprising several millions, or even several billions, of such memory cells.

SUMMARY

Thus, an embodiment provides a memory cell comprising a heating element topped with a phase-change material, two first silicon oxide regions which laterally surround the heating element along a first direction, and two second silicon oxide regions which laterally surround the heating element along a second direction orthogonal to the first direction.

According to an embodiment, the heating element is separated from each of the first regions by a third silicon nitride region.

According to an embodiment, the third regions comprise spacers.

According to an embodiment, the heating element is separated from each of the two second regions by a fourth silicon nitride region.

According to an embodiment, the two second regions have edges parallel to the first direction, and the first regions extend between said edges parallel to the first direction.

According to an embodiment, the heating element is arranged on a via crossing an insulating layer.

Another embodiment provides an electronic chip comprising a memory cell such as defined hereabove.

An embodiment provides a method of manufacturing a memory cell, successively comprising: a) forming a first silicon oxide layer; b) partially etching the first layer across its entire thickness while leaving in place a portion of the first layer; c) forming a second layer made of a material of a future heating element, the second layer covering a side of the portion of the first layer left in place at step b); d) partially etching the second layer across its entire thickness while leaving in place a portion of the second layer covering said side; e) forming, in the portions etched at step b), a third silicon oxide layer having a thickness greater than or equal to that of the first layer; f) defining the heating element in said portion of the second layer, by removing by etching portions of the structure obtained at step e) which surround the heating element; and g) forming in the portions etched at step f) a fourth silicon oxide layer having a thickness greater than or equal to that of the first layer.

According to an embodiment, the method comprises: before step a), forming an insulating layer and a via crossing the insulating layer; and after step e), forming a phase-change material.

According to an embodiment, the method comprises: before step c), forming a first spacer against said side; and before step d), forming a second spacer against the portion of the second layer located on said side.

According to an embodiment, the first and second spacers are made of silicon nitride.

According to an embodiment, the method comprises, between steps d) and e), forming a third spacer against the second spacer.

According to an embodiment, the method comprises, between steps e) and f), conformally forming a fifth silicon nitride layer.

According to an embodiment, the portions removed at step f) delimit a strip extending in a direction orthogonal to said side.

BRIEF DESCRIPTION OF THE DRAWINGS

The foregoing and other features and advantages will be discussed in detail in the following non-limiting description of specific embodiments in connection with the accompanying drawings; wherein:

FIGS. 2A to 2D are cross-section views illustrating steps of the forming of elements of the memory cell of FIG. 1; and FIGS. 3A to 3I schematically illustrate steps of an embodiment of a method of manufacturing a memory cell comprising a phase-change material.

DETAILED DESCRIPTION

Figure 1:
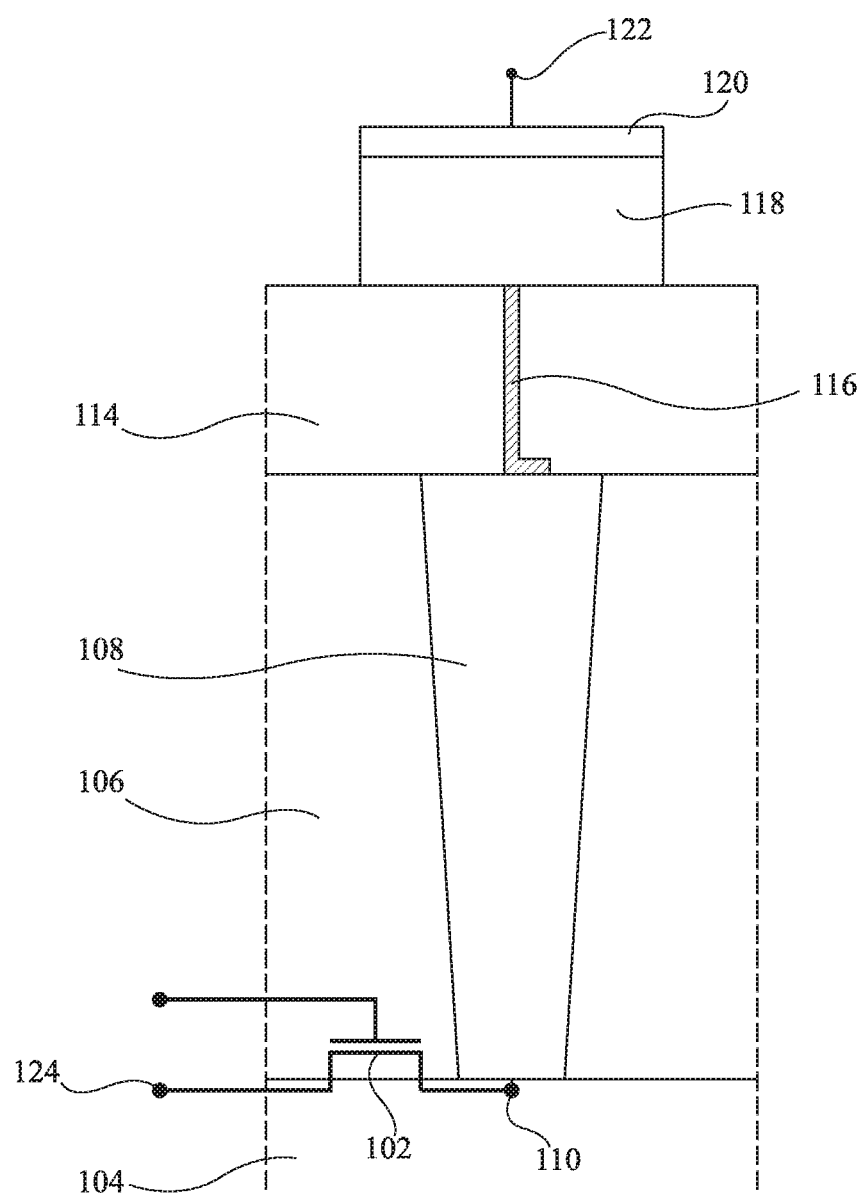
FIG. 1 is a simplified cross-section view of a memory cell comprising a phase-change material.

The same elements have been designated with the same reference numerals in the various drawings and, further, the various drawings are not to scale. For clarity, only those steps and elements which are useful to the understanding of the described embodiments have been shown and are detailed.

In the following description, when reference is made to terms qualifying relative position, such as terms "above", "under", "upper", "lower", etc., or to qualifiers such as terms "horizontal", "vertical", etc., reference is made to the orientation of the concerned element in the drawings other than 3G and 3I, it being understood that, in practice, the described devices may have different orientations. Unless otherwise specified, expression "in the order of" means to within 10%, preferably to within 5%.

FIG. 1 is a simplified cross-section view of a memory cell comprising a phase-change material.

A transistor 102, for example, of MOS type, but which may also be bipolar, is located inside and on top of a semiconductor support 104. This transistor is symbolically represented with a source, drain and insulated gate. Transistor 102 and support 104 are covered with an electrically-insulating layer 106, for example, made of silicon oxide. An electrically-conductive via 108 vertically thoroughly crosses layer 106 and has its lower end in contact with drain 110 of transistor 102. The top of via 108 is, for example, flush with the upper surface of layer 106.

Layer 106 and via 108 are covered with an electrically-insulating layer 114, thoroughly crossed by a resistive element 116 arranged on via 108. Resistive element 116 is intended for the heating of a phase-change material 118 topping heating element 116 and insulating layer 114. Resistive heating element 116 is, for example, made of titanium silicon nitride TiSiN and typically has a vertically elongated shape. The height of heating element 116 is, for example, in the range from 30 to 150 nm. An example of heating element 116 and of insulating layer 114 is described hereafter in relation with FIG. 2D.

Phase-change material 118 is covered with a contacting area 120 connected to a node 122. Phase-change material 118, heating element 116, and transistor 102 are thus electrically series-connected between node 122 and source 124 of transistor 102.

FIGS. 2A to 2D are simplified cross-section views illustrating successive steps of the forming of heating element 116 and of insulating layer 114 of the memory cell of FIG. 1. The obtained insulating layer 114 is illustrated in FIG. 2D in more detailed fashion than in FIG. 1. The elements of the memory cell located under the upper level of insulating layer 106 have been previously formed.

At the step of FIG. 2A, a silicon nitride layer 114A covering layer 106 and the top of via 108, followed by a silicon oxide layer 202 covering the layer 114A, are successively deposited. A portion of layers 202 and 114A is then etched across their entire thickness so that the remaining portion of layers 202 and 114A exhibits a vertical side 204 vertically in line with via 108.

At the step of FIG. 2B, a layer 116A of the material of the future heating element 116 is deposited on the structure obtained at FIG. 2A. Heating element 116 will be formed of a portion of layer 116A. Layer 116A is conformally deposited, that is, deposited over all the exposed portions of the structure. Layer 116A thus covers side 204. On side 204, the thickness of layer 116A is, for example, in the range from 2 to 10 nm. The structure is then conformally covered with a silicon nitride layer 114B.

At the step of FIG. 2C, the horizontal portions of silicon nitride layer 114B are removed. The remaining portion of layer 114B forms a spacer. The exposed portions of layer 116A are then removed. The remaining portion of layer 116A comprises a vertical portion against side 204.

At the step of FIG. 2D, a silicon nitride spacer 114C is formed against spacer 114B. There remains next to spacer 114C a region 206 where layer 106 is exposed. A silicon oxide layer 114D having a thickness at least equal to that of layer 114A is deposited in region 206. All the elements of the structure located above the upper level of layer 114A are then removed, for example, by chemical-mechanical polishing (CMP).

The complete memory cell is obtained at a subsequent step. The remaining portion of silicon nitride layer 114A, spacers 114B and 114C, and the remaining portion of layer 114D correspond to insulating layer 114 of the memory cell. The remaining vertical portion of layer 116A corresponds to heating element 116 of the memory cell.

It should be noted that the use of silicon nitride for layer 114A and for spacers 114B and 114C enables for heating element 116 to be only in contact with silicon nitride. A contact between the heating element and a material such as silicon oxide, particularly that of reference 114D, is thus avoided. Such a contact would be likely to alter the material of the heating element, if the heating element is, for example, made of TiSiN.

To program or erase the memory cell, the memory cell is selected by the turning on of transistor 102 and a voltage is applied between node 122 and source 124. A current runs through heating element 116, which generates heat, and the temperature of the heating element strongly rises. The phase-change material in contact with heating element 116 melts (for the programming) or recrystallizes (for the erasing).

A problem is that part of the generated heat, rather than being used to raise the temperature of heating element 116 and thus to melt or recrystallize material 118, is absorbed or dissipated by the materials surrounding the heating element, particularly by the silicon nitride of layer 114A. A large amount of heat then has to be generated to obtain, in heating element 116, a temperature sufficient for the memory cell to be programmed or erased. This results in the issue, mentioned above, of high programming and erase currents. Transistor 102 should have large dimensions to allow the flowing of such currents, which raises a compactness issue. Such a compactness issue arises, in particular, for memory cells arranged next to one another, typically, for memory cells arranged in an array.

Another issue arises in the case of memory cells arranged next to one another. Indeed, on programming of one of the memory cells, the heat generated in the heating element is propagated, particularly by silicon nitride portion 114A, to a neighboring memory cell which may be in the programmed state. Thereby, the neighboring memory cell heats up. A distance sufficient to limit such a heating should then be provided between memory cells, to avoid for the heating to cause the erasing of the neighboring memory cell.

To resolve these issues, it is here provided for the heating element to be totally surrounded with silicon oxide. Indeed, silicon oxide has a low heat conductivity, below a value in the order of 1.5 W/(m·K), that is, for example, from 10 to 40 times smaller than that of silicon nitride (which may, for example, be in the order of 17 W/(m·K)). To achieve this, it is in particular provided to replace most of silicon nitride region 114A with silicon oxide. A method enabling, in particular, to obtain a heating element totally laterally surrounded with silicon oxide but protected against any direct contact with the silicon oxide is described hereafter.

Figure 3A:
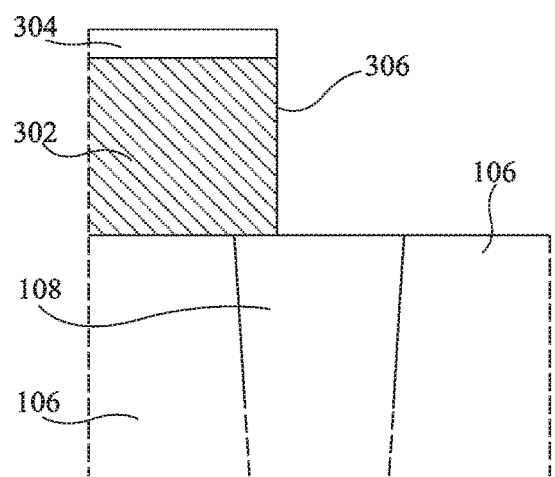

FIGS. 3A to 3I schematically illustrate successive steps of an embodiment of a method of manufacturing a memory cell comprising a phase-change material. The memory cell is, for example, a memory cell of a memory cell array. FIGS. 3A to 3E are vertical cross-section views in the array row direction. FIGS. 3F to 3H are vertical cross-section views in the array column direction. FIGS. 3G and 3I are cross-section top views (horizontal cross-section).

At the step of FIG. 3A, a via 108 crossing an insulating layer 106, such as described in relation with FIG. 1, has been formed. The top of via 108 and layer 106 are topped with a layer 302. Unlike silicon nitride layer 114A of FIGS. 2A to 2D, layer 302 is made of silicon oxide. Layer 302 is covered with a silicon nitride layer 304. As an example, the thickness of layer 302 is in the range from 30 to 200 nm. The thickness of layer 304 is, for example, in the range from 10 to 40 nm.

A portion of layers 304 and 302 is then etched across their entire thickness so that the remaining portions of layers 304 and 302 have a vertical side 306.

Figure 3B:
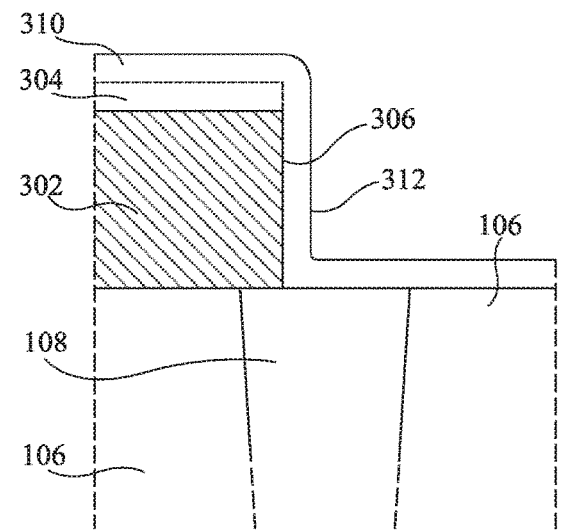

At the step of FIG. 3B, a silicon nitride layer 310 is conformally deposited. The thickness of layer 310 is, for example, smaller than 20 nm, for example, in the range from 5 to 30 nm. Layer 310 has, in its portion covering side 306, a vertical exposed surface 312. The position of side 306 and the thickness of layer 310 are provided so that surface 312 is located vertically in line with via 308.

Figure 3C:
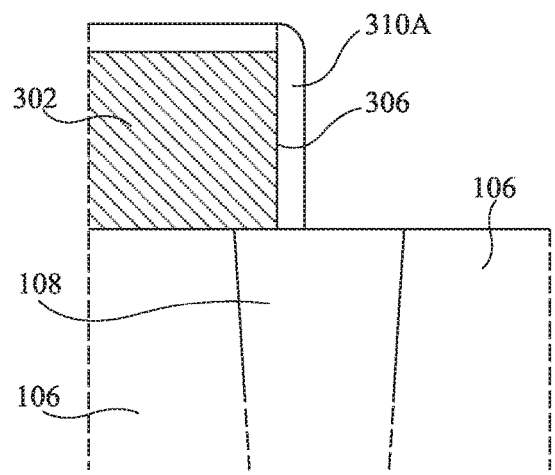

At the step of FIG. 3C, the silicon nitride is anisotropically etched to remove the horizontal portions of layer 310. A silicon nitride spacer 310A, located against side 306 of silicon oxide layer 302, is obtained.

Figure 3D:
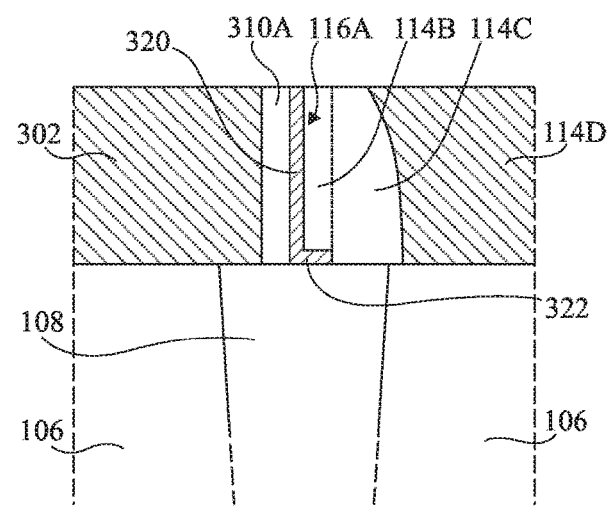

At the step of FIG. 3D, steps similar to those described in relation with FIGS. 2B to 2D are successively implemented, with the difference that the portions of layers 114A and 202 of FIGS. 2B to 2D are replaced with portions of layers 304 and 302 and spacer 310A. One thus successively forms:
- a portion of a layer 116A made of the material of the future heating element against spacer 310A, covered with a silicon nitride spacer 114B;
- a silicon nitride spacer 114C against spacer 114B; and
- a silicon oxide layer portion 114D against spacer 114C.

In the obtained structure, the remaining portion of layer 116A is laterally surrounded with the two silicon oxide regions formed by layer portions 302 and 114D. The remaining portion of layer 116A comprises a vertical portion 320 located against spacer 310A and a horizontal portion 322 under spacer 114B. Spacer 114C covers the side of portion 322. The remaining portion of layer 116A is thus not in contact with the silicon oxide of region 302 or 114D.

At the step of FIG. 3E, a layer made of a phase-change material 118 covering the structure obtained at the step of FIG. 3D is deposited. Layer 118 is covered with an electrically-conductive layer 120, for example, made of titanium nitride, intended to form a contacting area on the phase-change material. A silicon nitride masking layer 334 is then, for example, formed on the structure. As an example, the thickness of layer 118 is in the range from 30 to 150 nm. The thickness of layer 120 is for example in the range from 15 to 50 nm. The thickness of layer 334 is, for example, in the range from 5 to 40 nm. As a variation, layer 334 may be omitted.

FIG. 3F has the vertical plane F-F running through heating element 116, shown in FIG. 3E, as a cross-section plane. At the step of FIG. 3F, the structure is etched from the upper surface of layer 334 to the upper level of layer 106, while leaving in place a central region 342. Heating element 116, formed of the portion of layer 116A located in strip 342, has thus been defined. As an example, the width of strip 342 is in the range from 5 to 50 nm.

FIG. 3G is a cross-section view of the structure obtained at the step of FIG. 3F along a horizontal plane G-G crossing heating element 116. The central region, for example, has in top view the shape of a strip 342 extending in the direction of the memory cell array rows. Strip 342 runs over at least a portion of via 108.

FIG. 3H has as a cross-section plane a vertical plane running through heating element 116. At the step of FIG. 3H, a silicon nitride layer 350 is conformally deposited. Layer 350 particularly covers the vertical sides of the elements located in strip 342. A silicon oxide layer 352 covering the structure and, for example, reaching a level located above that reached by layer 350 in central region 342 is then deposited.

FIG. 3I is a cross-section view of the obtained memory cell, along a horizontal plane running through heating element 116. Heating element 116 is surrounded along a first direction, for example, the row direction of the memory cell array, by silicon oxide regions 302 and 114D. Heating element 116 is further surrounded along a second direction, for example, the array column direction, with two regions of layer 352. In the example illustrated in FIG. 3I, heating element 116 is located between edges 354 of the regions of layer 352, edges 354 being parallel to the row direction. Regions 302 and 114D extend between edges 354 parallel to the row direction, on either side of the heating element.

Due to the fact that the heating element is thus laterally surrounded with silicon oxide, which, as previously indicated, is an excellent thermal insulator, it is avoided, when the heating element heats up, for example, during the programming of the memory cell, for the regions surrounding the heating element to also heat up. A small quantity of generated heat is then sufficient for the temperature of heating element 116 to strongly rise and for the memory cell to be programmed or erased. The programming and erasing currents are thus decreased.

Further, the memory cells arranged next to one another in the array may be particularly close to one another without risking, during the programming of a memory cell, erasing a neighboring memory cell which has already been programmed. Indeed, silicon oxide regions 302 and 114D enable to limit the propagation of heat from heating element 116 to the neighboring memory cells of the same row of the array. Regions 352 enable to limit the propagation of heat from heating element 116 to the neighboring memory cells of the same column of the array.

As already mentioned, heating element 116 is separated from silicon oxide region 302 by silicon nitride spacers 310A, and from silicon oxide region 114B by spacers 114B and 114C. Heating element 116 is further separated from the regions of silicon oxide layer 352 by silicon nitride layer 350. Contacts of the heating element with the silicon oxide which surrounds it are thus avoided.

Specific embodiments have been described. Various alterations, modifications, and improvements will occur to those skilled in the art. In particular, in the method of FIGS. 3A to 3I, the step of FIG. 3E may be omitted, and phase-change material 118 and contacting area 120 may be formed at a step subsequent to the step of FIG. 3H instead of this step. Although, at the step of FIG. 3H, the level reached by layer 352 is above the elements located in region 342, the upper level of layer 352 may be any level located above that of the top of heating element 116. Silicon oxide spacers 310A and 114B around heating element 116 have been described. It will be within the abilities of those skilled in the art to select other dielectric materials capable of being arranged in contact with heating element 116 without altering it, for example, during the heating or, for example, during a memory cell programming phase, in particular without oxidizing the heating element.

Although, at the step of FIG. 3F, central region 342 left in place during the etching is strip-shaped, the central region may have any other shape capable of defining heating element 116 in layer 116A by an etching leaving in place the central region.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A memory cell, comprising:
a heating element including a vertical portion and a horizontal portion extending from the vertical portion;
a phase-change material on top of the heating element;
a first silicon nitride region and second silicon nitride region which are in contact with the vertical portion of the heating element and laterally surround the heating element in a first direction;
a third silicon nitride region which is in contact with the second silicon nitride region in the first direction and further in contact with an end of the horizontal portion of the heating element;
a fourth silicon nitride region and fifth silicon nitride region which are in contact with the vertical portion of the heating element and laterally surround the heating element in a second direction orthogonal to the first direction;
two first silicon oxide regions in contact with the first and third silicon nitride regions in the first direction; and
two second silicon oxide regions which are in contact the fourth and fifth silicon nitride regions in the second direction orthogonal to the first direction;
wherein a height of the vertical portion of the heating element is equal to a thickness of the two first silicon oxide regions.

2. The memory cell of claim 1, wherein an upper surface of the first, second and third silicon nitride regions is coplanar with both an upper surface of the vertical portion of the heating element and an upper surface of the two first silicon oxide regions.

3. The memory cell of claim 2, wherein the first, second and third silicon nitride regions comprise spacers in the first direction between the heating element and the two first silicon oxide regions.

4. The memory cell of claim 1, wherein the two second silicon oxide regions have edges parallel to the first direction, and the two first silicon oxide regions extend between said edges parallel to the first direction.

5. The memory cell of claim 1, wherein the heating element is located on a via crossing an insulating layer.

6. An electronic chip comprising a memory cell wherein the memory cell comprises:
a heating element including a vertical portion and a horizontal portion extending from the vertical portion;
a phase-change material on top of the heating element;
a first silicon nitride region and second silicon nitride region which are in contact with the vertical portion of the heating element and laterally surround the heating element in a first direction;
a third silicon nitride region which is in contact with the second silicon nitride region in the first direction and further in contact with an end of the horizontal portion of the heating element;
two first silicon oxide regions in contact with the first and third silicon nitride regions in the first directions; and
two second silicon oxide regions which laterally surround the heating element in a second direction orthogonal to the first direction;
wherein a height of the vertical portion of the heating element is equal to a thickness of the two first silicon oxide regions.

7. The electronic chip of claim 6, wherein an upper surface of the first, second and third silicon nitride regions is coplanar with both an upper surface of the vertical portion of the heating element and an upper surface of the two first silicon oxide regions.

8. The electronic chip of claim 7, wherein the first, second and third silicon nitride regions comprise spacers in the first direction between the heating element and the two first silicon oxide regions.

9. The electronic chip of claim 6, further comprising a fourth silicon nitride region and fifth silicon nitride region which are in contact with the vertical portion of the heating element and laterally surround the heating element in the second direction; and wherein the heating element is respectively separated from the two second silicon oxide regions by said fourth and fifth silicon nitride regions.

10. The electronic chip of claim 6, wherein the two second silicon oxide regions have edges parallel to the first direction, and the two first silicon oxide regions extend between said edges parallel to the first direction.

11. The electronic chip of claim 6, wherein the heating element is located on a via crossing an insulating layer.

* * * * *